United States Patent [19]

Ribner et al.

[11] Patent Number: 5,065,157
[45] Date of Patent: Nov. 12, 1991

[54] HIGH ORDER SIGMA DELTA OVERSAMPLED ANALOG-TO-DIGITAL CONVERTER INTEGRATED CIRCUIT NETWORK WITH MINIMAL POWER DISSIPATION AND CHIP AREA REQUIREMENTS

[75] Inventors: David B. Ribner, Schenectady; Richard D. Baertsch, Scotia, both of N.Y.

[73] Assignee: General Electric Company, Schenectady, N.Y.

[21] Appl. No.: 505,382

[22] Filed: Apr. 6, 1990

[51] Int. Cl.$^5$ ............................................. H03M 3/02
[52] U.S. Cl. .................................... 341/143; 341/166
[58] Field of Search ............... 341/143, 122, 123, 144, 341/155, 158, 166, 167, 200; 375/27, 28, 33; 364/724.04; 332/11 D; 357/40, 51

[56] References Cited

U.S. PATENT DOCUMENTS

| 4,380,756 | 4/1983 | Worsman | 341/172 |
| 4,704,600 | 11/1987 | Uchimura et al. | 341/143 |
| 4,876,542 | 10/1989 | Van Bavel et al. | 341/143 |
| 4,896,156 | 1/1990 | Garverick | 341/143 |

OTHER PUBLICATIONS

T. Hayashi et al., "A Multistage Delta–Sigma Modulator Without Double Integrator Loop", Proc. IEEE 1986 Int. Solid–State Circuits Conf., pp. 182–183, Feb. 1986.
Y. Matsuya et al., "A 16-Bit Oversampling A-D Conversion Technology Using Triple Integration Noise Shaping", IEEE J. Solid–State Circuits, vol. SC-22, No. 6, pp. 921–929, Dec. 1987.
L. Longo et al., "A 13-Bit ISDN-Band ADC Using Two-Stage Third Ordcer Noise Shaping", Proc. 1988 Custom Integrated Circuit Conf., pp. 21.2.1–21.2.4, Jun. 1988.
R. Gregorian, "Analog MOS Integrated Circuits for Signal Processing", pp. 500–504, Wiley, New York, 1986.
R. Norsworthy et al., "A 13 Bit Sigma–Delta A/D Convertor for ISDN", Proc. IEEE Custom Integrated Circuits Conf., pp. 21.3.1–21.3.4, May 1988.
R. Gregorian, "Analog MOS Integrated Circuits for Signal Processing", pp. 277–280, Wiley, New York, 1986.
M. Hauser et al., "Circuit and Technology Considerations for MOS Delta–Sigma A/D Converters", IEEE 1986 Int. Symposium on Circuits and Systems Proceedings, pp. 1310–1315, May 1986.

Primary Examiner—A. D. Pellinen
Assistant Examiner—Brian K. Young
Attorney, Agent, or Firm—Marvin Snyder; James C. Davis, Jr.

[57] ABSTRACT

An improved high order interpolative oversampled (sigma delta) analog-to-digital converter network including a plurality of cascade-coupled integrator stages is formed on a single integrated circuit chip in a manner that conserves power and chip area. Each integrator stage includes a differential amplifier, at least one input capacitor and at least one feedback capacitor. The power dissipation and occupied chip area are minimized by down-sizing the chip area occupied by the capacitors and differential amplifiers (op amps) in all but the first integrator stage. The high gain of the first integrator stage makes the noise contribution of subsequent integrator stages negligible so that the higher noise of the subsequent integrator stages is tolerable.

12 Claims, 9 Drawing Sheets

HIGH ORDER SIGMA DELTA OVERSAMPLED ANALOG-TO-DIGITAL CONVERTER INTEGRATED CIRCUIT NETWORK WITH MINIMAL POWER DISSIPATION AND CHIP AREA REQUIREMENTS

CROSS REFERENCE TO RELATED APPLICATION

This application is related in subject matter to the copending U.S. patent application of David B. Ribner, entitled "Third Order Sigma Delta Oversampled Analog-To-Digital Converter Network With Low Component Sensitivity", Ser. No. 07/505,384, filed simultaneously herewith and assigned to the instant assignee, now abandoned in favor of continuation-in-part application Ser. No. 07/550,763, filed July 10, 1990. The subject matter thereof is hereby incorporated by reference.

BACKGROUND OF THE INVENTION

1. Field of the Invention

This invention generally relates to a high order sigma delta analog-to-digital converter and, more particularly, to a high order sigma delta oversampled analog-to-digital converter integrated circuit network which is economical in both power dissipation and chip area requirements.

2. General Description of the Prior Art

High resolution, analog-to-digital (or A/D) signal conversion can be achieved with lower resolution components through use of high order oversampled interpolative (or sigma delta) modulation followed by digital low pass filtering and decimation. Oversampling refers to operation of the modulator at a rate many times above the signal Nyquist rate, whereas decimation refers to reduction of the clock rate down to the Nyquist rate.

In the above type of analog-to-digital converters, resolution is predominantly governed by two factors: (1) the ratio of the modulator clock to the Nyquist rate, henceforth referred to as the oversampling ratio, and (2) the "order" of the modulator. Order in this context is analogous to the order of a frequency selective filter and indicates the relative degree of spectral shaping that is provided by the modulator. A "high order" analog-to-digital converter a third or higher order network.

As with a filter, higher selectivity is obtainable with a higher order at the expense of increased hardware complexity. In recognition of the aforementioned two factors governing resolution of oversampled analog-to-digital converter networks, recent implementations of high resolution oversampled analog-to-digital converters have employed both large oversampling ratios and high modulator order. However, practical considerations can limit the extent to which oversampling rate and modulator order can be taken. For instance, for a given modulator clock rate, the oversampling ratio is inversely proportional to the Nyquist rate after decimation and thus cannot be made arbitrarily high without sacrificing conversion rate. Different considerations set bounds on the modulator order. Implementation of order greater than two, using a single quantizer, can be shown to be only conditionally stable and are therefore not viable.

An alternative approach can be used to effectively provide high order noise shaping with cascaded low order modulators to ensure stable operation. Unfortunately, the matching of the modulators in such structure is crucial, and the degree of mismatch governs accuracy of the overall converter. Requirements of close component matching and high operational amplifier (or "op amp") gains imply that such circuit can only be manufactured with a low yield, and possibly will require trimming, thereby being expensive to produce.

Early work in this field has been directed at implementation of modulators of first and second order, due to the stability concerns connected with orders of three or greater. T. Hayashi et al., in "A Multistage Delta-Sigma Modulator Without Double Integrator Loop", *Proc. IEEE* 1986 *Int. Solid-State Circuits Conf.*, pp. 182–183, Feb. 1986, describe an approach in which second order performance is obtained using a cascade connection of two first order stages. The quantization error of the first stage is supplied to the second stage so that the second output signal, after a digital differentiation, contains a replica of the frequency-shaped quantization noise. Finally, a subtraction of the second stage output signal from that of the first stage yields a signal that contains only the quantization noise of the second stage with second order noise-shaping. However, this method requires tight matching of the characteristics of the two first order modulators and high op amp gains.

An extension of the above approach to third order analog-to-digital converter networks using a triple cascade connection of first order modulators is described by Y. Matsuya et al. in "A 16-Bit Oversampling A-D Conversion Technology Using Triple Integration Noise Shaping", *IEEE J. Solid-State Circuits*, Vol. SC-22, No. 6, pp. 921–929, Dec. 1987. However, this approach requires even tighter component matching and also requires high op amp gains in order to achieve the theoretically obtainable resolution.

A slightly different approach is disclosed by L. Longo and M. A. Copeland in "A 13-Bit ISDN-Band ADC Using Two-Stage Third Order Noise Shaping", *Proc.* 1988 *Custom Integrated Circuit Conf.*, pp. 21.2.1–4, June 1988, wherein a second order modulator is connected in cascade with a first order modulator to implement third order noise-shaping. This approach has the advantage of reducing the component matching requirements somewhat from the other implementations.

The aforementioned U.S. patent application of David B. Ribner, entitled "Third Order Sigma Delta Oversampled Analog-To-Digital Converter Network With Low Component Sensitivity", Ser. No. 07/505,384, now abandoned in favor of continuation-in-part application Ser. No. 07/550,763, filed July 10, 1990, describes an improved third order sigma delta analog-to-digital converter network which achieves third order noise shaping with reduced sensitivity to component mismatching and other nonidealities. An improved architecture for a third order sigma delta analog-to-digital converter network which can be implemented as a sampled-data switched-capacitor circuit is therein described. For enhanced accuracy and economical operation, it is desirable to minimize internal noise and reduce power requirements of such circuits.

If a high order oversampled analog-to-digital converter (or ADC) is to achieve accuracy beyond the 12 bit level, it must be designed so that its internal noise sources are suitably low. Such design requires use of large-valued capacitors to minimize kT/C noise (where T is circuit absolute temperature (°K.), C is the sampling capacitance (farads), and k is Boltzmann's constant), and often requires chopper stabilization to reduce low frequency op amp flicker (or 1/f) noise. A discussion of 1/f noise is presented in R. Gregorian, "Analog MOS Integrated Circuits for Signal Processing", pp. 500-504, Wiley, New York, 1986, incorporated herein by reference. A major disadvantage of using these options is the requirement for increased area on the integrated circuit (IC) chip to be occupied by the larger capacitors, for the corresponding larger op amps required to drive the capacitors, and the chopper circuitry. Another resulting problem is a much increased power dissipation accompanying operation with large capacitances.

Previous ADC implementations employ identical circuitry at each stage in high order modulators, operate at high power levels, and require large portions of IC chip area. See, for example, S. R. Norsworthy and I. G. Post, "A 13 Bit Sigma-Delta A/D Convertor For ISDN", Proc. *IEEE Custom Integrated Circuits Conf.*, pp. 21.3.1-4, May 1988, and the aforementioned Y. Matsuya et al. and L. Longo et al. papers.

SUMMARY OF THE INVENTION

It is therefore an object of the present invention to reduce the required power dissipation and chip area of any type of monolithic integrated circuit high order oversampled analog-to-digital converter.

Another object of the invention is to provide an improved high order sigma delta analog-to-digital converter which operates at a minimal power level and occupies minimal IC chip area.

Another object of the invention is to provide an improved architecture for a third order sigma delta analog-to-digital converter which can be implemented as a sampled data switched capacitor circuit on an integrated circuit chip in a small portion of the chip area and with minimal power dissipation.

The invention constitutes a high order oversampled interpolative (sigma delta) analog-to-digital converter network which requires less power and less integrated circuit chip area than in the past. The analog-to-digital converter network of the invention includes a plurality of integrator stages coupled in cascade and formed on a single integrated circuit chip. In one embodiment, each integrator stage includes a differential amplifier, an input capacitor and a feedback capacitor. The power dissipation and IC chip area of the improved modulator network is reduced by down-sizing the areas of capacitors and differential amplifiers (i.e., op amps) in all but the first integrator stage. In the analog signal undergoing modulation, the high gain of the first integrator stage makes the noise contribution of subsequent integrator stages negligible so that the higher noise of the subsequent integrator stages is tolerable.

Analysis and simulation show that in oversampled modulators of order greater than one, the noise of the first integrator is dominant, and the noise of subsequent integrators is negligible when referred to the input. This is attributable to the reduction of input-referred noise in subsequent integrators that results from the relatively high gain of the first integrator over the signal bandwidth. In exploiting this phenomenon, the invention holds the noise of the first integrator to a low level by use of large capacitors to reduce kT/C noise. The first integrator consequently requires a relatively large area, high-powered op amp to charge and discharge the large capacitors. In the subsequent integrators, there is no severe noise constraint so that each may employ small capacitors along with a small area, low power op amp. Also, while chopper stabilization may be employed in the first integrator, chopping is unnecessary in the subsequent integrators. This approach is applicable to analog-to-digital converters employing virtually any second or higher order modulator using more than one stage, and its benefit increases with higher order.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a block diagram illustrating a known sigma delta analog-to-digital converter;

FIGS. 2(*a*), 2(*b*), 2(*d*) and 2(*e*) illustrate typical power spectra associated with operation of the analog-to-digital converter of FIG. 1, while FIG. 2(*c*) represents a typical filter characteristic for the decimation filter of FIG. 1;

DETAILED DESCRIPTION OF A PREFERRED EMBODIMENT OF THE INVENTION

Figures 1, 2A, 2B, 2C, 2D, 2E:
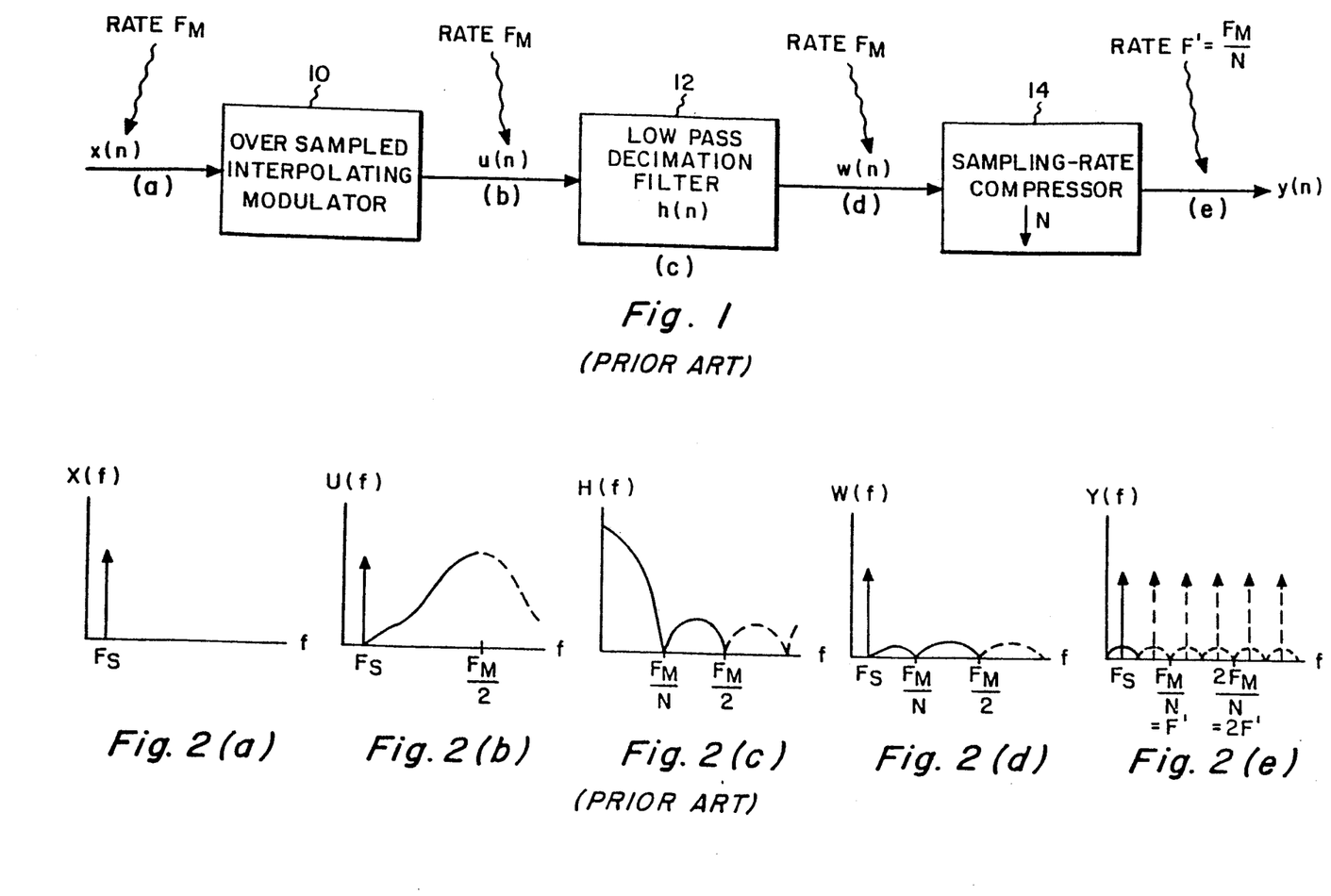

FIG. 1 shows a known embodiment of sigma delta analog-to-digital converter in which an oversampled interpolative (sigma delta) modulator 10 is coupled to a low pass decimation filter 12 which, in turn, is coupled to a sampling-rate compressor 14. The role of modulator 10 is to shape spectrally the quantization noise of a low resolution analog-to-digital converter so that it is predominantly concentrated at high frequency. The input signal x(n) to modulator 10 is a pure sinusoid of frequency $F_s$ and is sampled by modulator 10 at a sampling rate $F_M$. Subsequent low pass filtering and decimation can be used to remove the bulk of the quantization noise, resulting in a high resolution digital output signal at a reduced conversion rate $F_M/N$ where N is the oversampling ratio, or ratio of the output clock rate (F') to the input clock (or sample) rate $F_M$.

In FIG. 1, the following functions are represented: input signal x(n), modulator output signal u(n), filter output signal w(n), and A/D converter output signal y(n), along with the filter impulse response characteristic h(n). The corresponding frequency spectra $|X(f)|, |U(f)|, |W(f)|,$ and $|Y(f)|$, and filter characteristic $|H(f)|$, respectively, are shown in FIGS. 2(a), 2(b), 2(d), 2(e) and 2(c), respectively, and represent the conditions in the circuit of FIG. 1 at locations (a), (b), (d), (e) and 2(c), respectively. These frequency spectra illustrate the noise shaping provided by modulator 10 and the high frequency noise rejection provided by decimation filter 12 prior to the sampling rate conversion performed by compressor 14.

Figure 3:
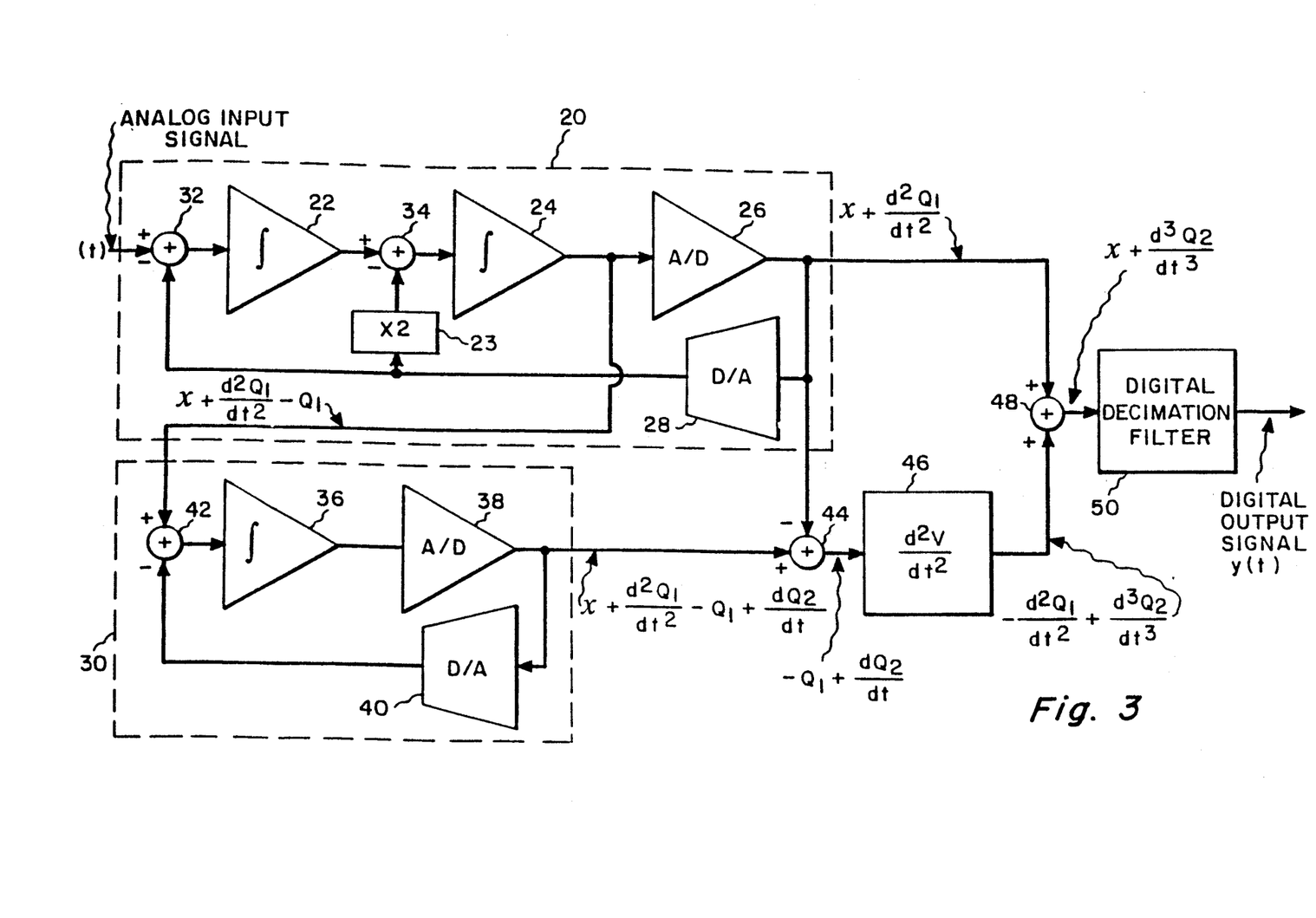
FIG. 3 is a circuit block diagram illustrating a high (i.e., third) order, sigma delta analog-to-digital converter network employing the present invention.

A simplified block diagram of a third order sigma delta modulator in which the invention is applicable is shown in FIG. 3 and includes a second order modulator 20 coupled to a first order modulator 30. Second order modulator 20 includes a pair of cascaded integrators 22 and 24, an analog-to-digital converter 26 coupled to the output of integrator 24, and a digital-to-analog (D/A) converter 28 coupled in a first feedback loop between the output of analog-to-digital converter 26 and the input of integrator 22 via a subtractive summing unit 32 and in a second feedback loop between the output of analog-to-digital converter 26 and the input of integrator 24 via an amplifier 23 having a gain of 2 and a subtractive summing unit 34 connected in series.

Second order modulator 20 responds to an analog input signal x(t) and at low frequencies $\omega << \pi/T$, where T is the sampling period and $T = 1/F_M$, produces a digital output signal of approximately $$x + d^2 Q_1 / dt^2$$

containing a component x, which is a digital representation of the ideal analog input signal, along with a shaped quantization noise signal $d^2 Q_1/dt^2$. The noise component $Q_1$ from second order modulator 20 is effectively doubly differentiated by the two-integrator loop and is pushed to high frequency. The signal applied to analog-to-digital converter 26 is an analog signal $$x + d^2 Q_1 / dt^2 - Q_1$$

equal to the digital output signal $x + d^2 Q_1/dt^2$ less the additive quantization noise $Q_1$ and is applied to first order modulator 30.

First order modulator 30 includes a single integrator 36 coupled to an analog-to-digital converter 38. A digital-to-analog converter 40 is coupled in a feedback loop between the output of analog-to-digital converter 38 and the input of integrator 36 via a subtractive summing unit 42. The first order modulator 30, at low frequencies $\omega << \pi/T$, produces a digital output signal $$x + d^2 Q_1 / dt^2 - Q_1 + dQ_2 / dt$$

which is equal to an exact replica of its input signal plug the additive quantization noise signal $dQ_2/dt$.

A digital subtractor 44 is coupled to the outputs of second order modulator 20 and first order modulator 30 to determine the difference between the digital output signals from modulators 20 and 30. A digital double differentiator 46 is coupled to the output of digital subtractor 44 for twice differentiating the digital difference signal from digital subtractor 44. A digital adder 48 is coupled to the outputs of second order modulator 20 and digital double differentiator 46 to add the digital output signal from modulator 20 to the resultant digital output signal produced by digital double differentiator 46. The digital output signal produced by adder 48 is applied to a digital decimation filter 50.

Ignoring for now the output quantization noise $dQ_2/dt$ of modulator 30, the difference between the two digital output signals from modulators 20 and 30 is exactly equal to minus the quantization noise $(-Q_1)$ of second order modulator 20. A double differentiated signal $(-d^2 Q_1/dt^2)$ from digital double differentiator 46 is added to the digital output signal of second order modulator 20 by digital adder 48 to effect the cancellation of the quantization noise $Q_1$ of modulator 20.

Considering now the quantization noise signal $dQ_2/dt$ that was previously ignored, the noise signal $Q_2$ has been differentiated once by first order modulator 30, generating a signal $dQ_2/dt$. It is further differentiated two more times by digital differentiator 46 so that, in the output signal y(t) from adder 48, the only noise is the triple differentiated noise signal $d^3 Q_2/dt^3$. This amounts to a third order shaping of the quantization noise which greatly attenuates its baseband components and emphasizes its high frequency power. The triple differentiated noise signal $d^3 Q_2/dt^3$ is effectively eliminated from the final digital output signal by digital decimation filter 50.

Figure 4:
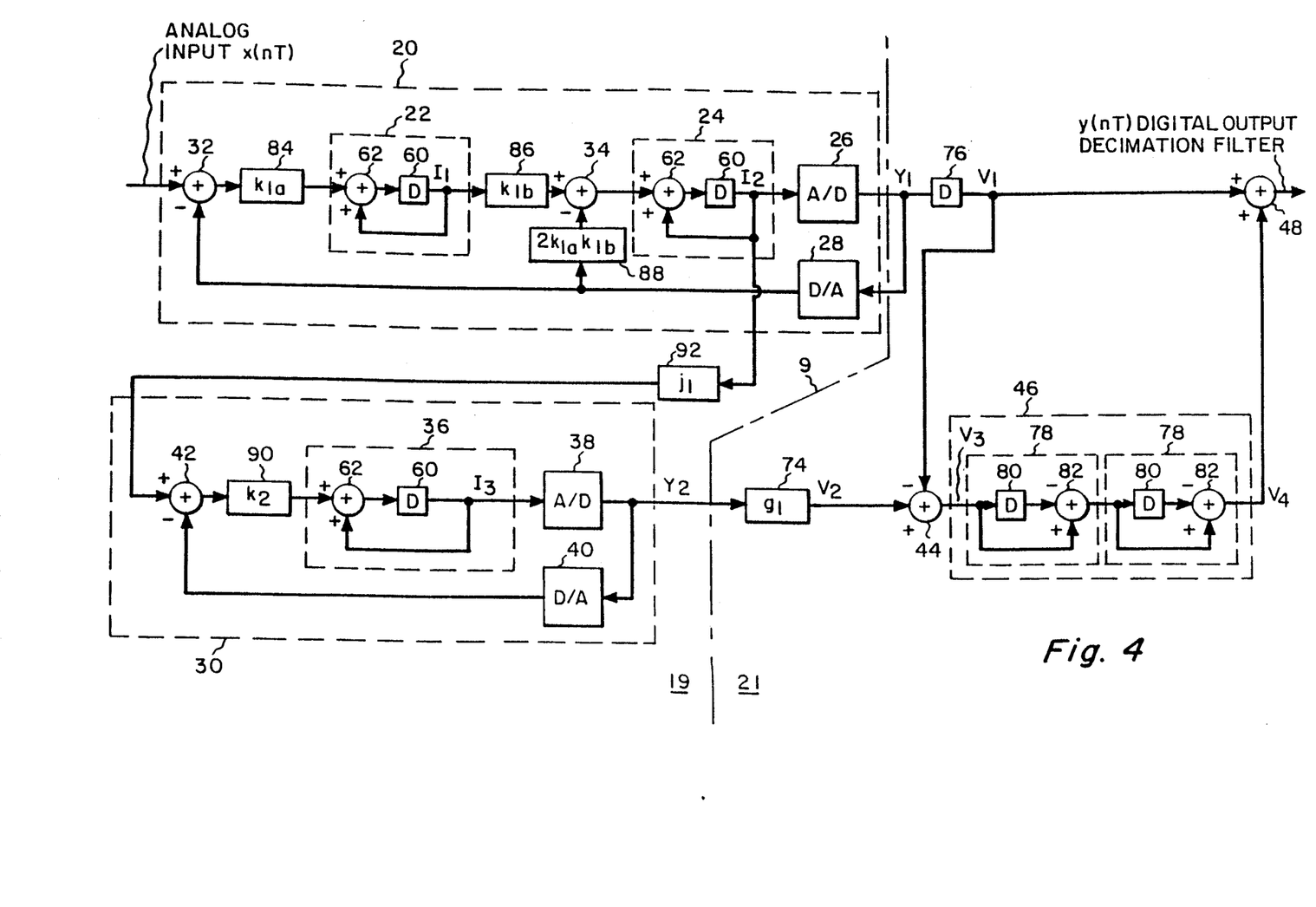
FIG. 4 is a functional block diagram of one version of the high (i.e., third) order sigma delta analog-to-digital converter network employing the present invention.

The intended implementation of the high order sigma delta analog-to-digital converter network is in a sampled data switched capacitor third order circuit in accordance with the discrete-time domain functional block diagram of FIG. 4. A design objective with over-sampled modulators is the scaling of analog signal levels to be on the order of the reference voltage. Therefore, a discrete time version is shown in FIG. 4 to indicate that such version is possible for the converter network in which the present invention is embodied.

In FIG. 4, each of integrators 22, 24 and 36 is shown as a one cycle delay register 60 preceded by an adder (or summing) unit 62. Digital double differentiator 46 is shown as a pair of cascaded differentiators 78, each comprising a delay register 80 followed by a digital subtractor 82.

An amplifier 84 having a gain coefficient $k_{1a}$ is situated in second order modulator 20 at the input to an integrator 22 and following a summing unit 32. An amplifier 86 with a gain coefficient $k_{1b}$ couples the output of integrator 22 to the input of an integrator 24 through a summing unit 34. Another amplifier 88 with a gain coefficient $2k_{1a}k_{1b}$ is situated in a feedback loop of second order modulator 20 between the output of a digital-to-analog converter 28 and a negative input to summing unit 34, while a second feedback loop in modulator 20 is provided by coupling the output of converter 28 to a negative input of summing unit 32. An amplifier 92 of gain $j_1$ couples the output of integrator 24 to a subtractive summing unit 42 in first order modulator 30, while an amplifier 90 having a gain coefficient $k_2$ is situated at the input of integrator 36 after summing unit 42.

A digital multiplier 74 having a multiplier coefficient $g_1$ couples the output of analog-to-digital converter 38 of first order modulator 30 to digital subtractor 44, while digital-to-analog converter 40 couples the output of analog-to-digital converter 38 to subtractive summing unit 42. The output of analog-to-digital converter 26 of second order modulator 20 is connected through a delay register 76 to the negative input of digital subtractor 44 and to digital adder 48. A dashed line 9 designates the separation between digital circuitry 21 and analog circuitry 19.

In FIG. 4, coefficients $k_{1a}$, $k_{1b}$, $k_2$, and $j_1$ are analog scaling coefficients, whereas $g_1$ is a digital multiplier coefficient. These coefficients must be related according to:

$$j_1 g_1 = 1/(k_{1a} k_{1b}). \qquad (1)$$

These relationships have meaning only for the case where only one-bit analog-to-digital converters and only one-bit digital-to-analog converters are used. Normally the k coefficients are made less than one so as to reduce the level of internal voltages within the modulator and thereby avoid clipping. Analysis of the network of FIG. 4 results in an input signal/output signal relationship in the discrete time domain of $$v_o(n) = v_i(n-3) + g_1[e_2(n) - 3e_2(n-1) + 3e_2(n-2) - e_2(n-3)] \qquad (2)$$

and of $$V_o(z) = z^{-3} V_i(z) + g_1(1-z^{-1})^3 E_2(z) \qquad (3)$$

in the corresponding frequency domain, where n represents the discrete time instant nT (T being the sample period), z is the discrete time frequency variable and $E_2$ is the quantization error of the second stage. it should be noted that a trade-off exists between voltage levels and output noise intensity; specifically, if scaling is employed, then the condition $k_{1a}k_{1b}<1$ imposes $g_1>1$ and the output error is increased proportionately as indicated by Equations 2 and 3.

While the implementation shown in FIG. 4 implies the use of one-bit A/D converters and D/A converters, it should be noted that improvements in performance can be achieved by using multiple bit A/D and D/A converters. For cases where the quantization levels L are greater than one bit, i.e., $L>1$, then $k_{1a}=k_{1b}=k_2=1$ in FIG. 4 and $j_1 g_1 = 1$.

Figure 5:
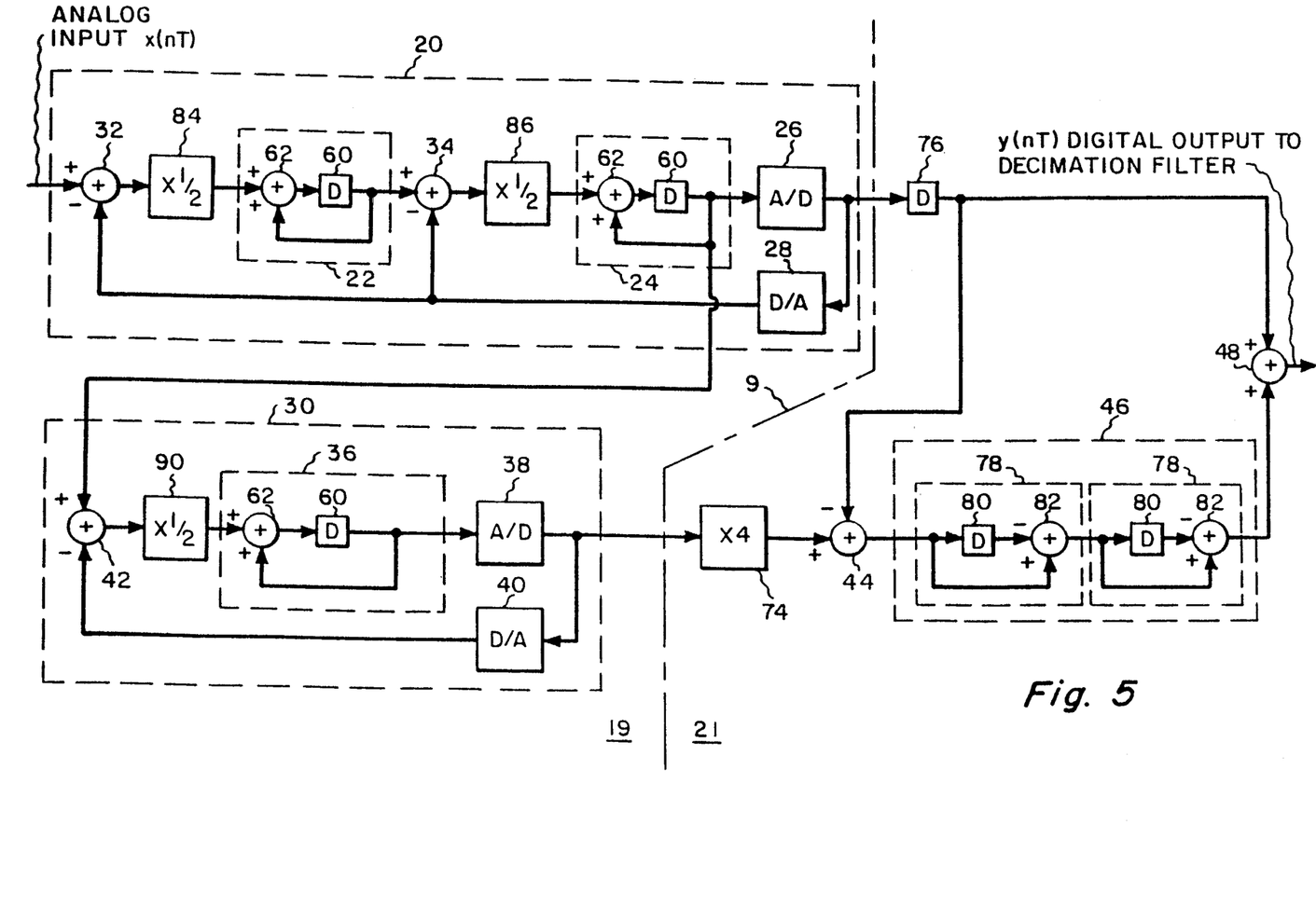
FIG. 5 is a functional block diagram of a specific embodiment of the high (i.e., third) order sigma delta analog-to-digital converter network employing the present invention.

A specific implementation of a third order sigma delta oversampled A/D converter network employing the invention is shown in FIG. 5, with L=1, $k_{1a}=k_{1b}=k_2=\frac{1}{2}$, $j_1=1$ and $g_1=4$. Thus amplifiers 84 and 86 in second order modulator 20 and amplifier 90 in first order modulator 30 each have a gain coefficient of $\frac{1}{2}$, and digital multiplier 74 has a multiplier coefficient of 4. (Amplifier 92 with a gain coefficient $j_1=1$ and amplifier 88 with a gain coefficient $2k_{1a}k_{1b}=\frac{1}{2}$, employed in the circuit of FIG. 4, are not shown in the circuit of FIG. 5.) This implementation requires only one-bit A/D and D/A converters.

Figure 6:
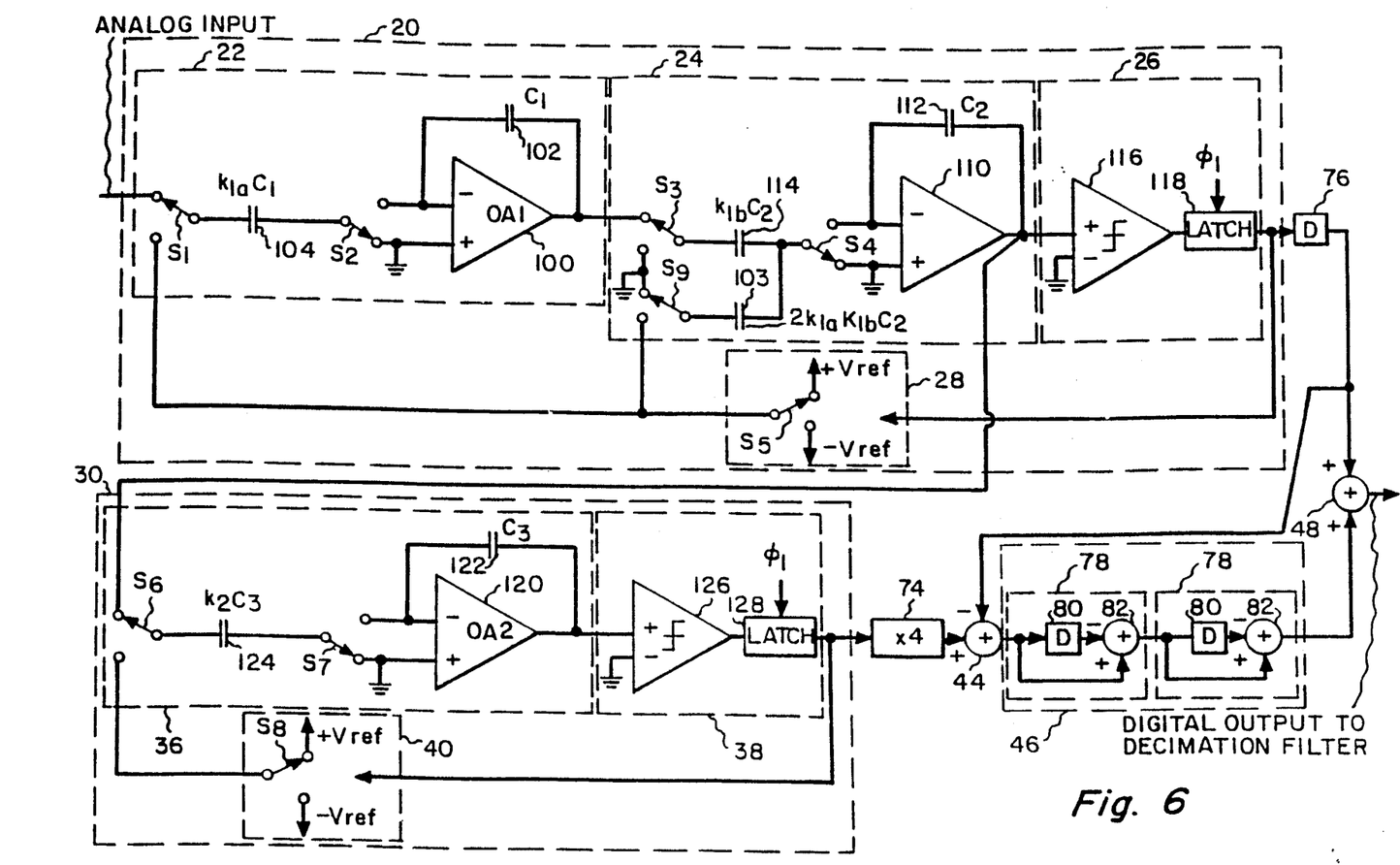
FIG. 6 is a circuit block diagram of a sampled data switched capacitor implementation of the third order sigma delta analog-to-digital converter network of FIG. 5.

A switched capacitor implementation of the network of FIG. 5 is shown in FIG. 6 and employs a single-ended signal flow and stray-free integrators. Such integrators are described, for example, in R. Gregorian, "Analog MOS Integrated Circuits for Signal Processing" previously cited, at pages 277-280, incorporated herein by reference. In second order modulator 20, integrator 22 is embodied as a high gain differential amplifier (op amp) 100 provided with a feedback capacitor 102 and a switched input capacitor 104. A switch $S_1$ is provided for switching a capacitor 104 between the analog input signal and the feedback loop of modulator 20. A switch $S_2$ is provided for switching the output voltage of capacitor 104 between the two inputs of differential amplifier 100. Similarly, integrator 24 is embodied as a high gain differential amplifier (op amp) 110 provided with a feedback capacitor 112 and a pair of switched input capacitors 114 and 103. A switch $S_3$ is provided for switching capacitor 114 between the analog output signal from differential amplifier 100 and ground, while a switch $S_9$ is provided for switching capacitor 103 between the feedback loop of modulator 20 and ground. A switch $S_4$ is provided for switching the output voltages of capacitors 114 and 103 between the two inputs of differential amplifier 110. A comparator 116 operated at a sample rate $\phi_1$ converts the analog output signal from differential amplifier 110 into a binary output signal. This binary output signal is stored by a latch 118 and applied via a delay register 76 to the negative input of digital subtractor 44 and to digital adder 48. The output signal from latch 118 also controls a switch $S_5$ for switching the feedback loop between a positive reference voltage $+V_{ref}$ and a negative reference voltage $-V_{ref}$ depending on whether the polarity of the latched output signal from comparator 116 is positive or negative.

In first order modulator 30, integrator 36 is embodied as a high gain differential amplifier (op amp) 120 provided with a feedback capacitor 122 and a switched input capacitor 124. A switch $S_6$ is provided for switching capacitor 124 between the analog output signal from differential amplifier 110 and the feedback loop of modulator 30. A switch $S_7$ is provided for switching the output voltage of capacitor 124 between the two inputs of differential amplifier 120. A comparator 126 operated at a sampling rate $\phi_1$ converts the analog output signal from differential amplifier 120 into a binary output signal. This binary output signal is stored by a latch 128, multiplied by four by multiplier 74, and applied to digital subtractor 44. The output signal of latch 128 also controls a switch $S_8$ for switching the feedback loop between a positive reference voltage $+V_{ref}$ and a negative reference voltage $-V_{ref}$ depending on whether polarity of the latched output signal from comparator 126 is positive or negative. The digital difference signal produced by digital subtractor 44 is differentiated twice by digital double differentiator 46 and the resultant differentiated signal is applied to digital adder 48. The switches, which may be implemented by metal-oxide-semiconductor switching devices, as known in the art, are all shown in a common phase $\phi_1$.

Switches $S_1$-$S_4$, $S_6$, $S_7$ and $S_9$ are analog switches controlled by clock phase signals $\phi_1$, $\phi_2$ which are derived from an oscillator or clock circuit (not shown). The clock signals are nonoverlapped and 180° out of phase.

When switches $S_1$-$S_4$, $S_6$, $S_7$ and $S_9$ are in the positions illustrated in FIG. 6, capacitor 104 charges to the amplitude of the analog input signal while capacitor 114 charges to the output voltage of amp 100 and capacitor 124 charges to the output voltage of op amp 110. At the same time capacitor 103 is totally discharged.

Switches $S_5$ and $S_8$, both shown connected to a positive reference voltage, are controlled by the output signal of latch 118 and 128, respectively. Thus, when the latched value of the output signal of comparator 116 or 126 is high, switch $S_5$ or $S_8$, respectively, is connected to a positive reference voltage, and is connected to a negative reference voltage when the latched value of the output signal of comparator 116 or 126, respectively, is low.

Upon occurrence of phase $\phi_2$, the positions of switches $S_1$-$S_4$, $S_6$, $S_7$ and $S_9$ reverse from that shown in FIG. 6. Thus D/A converter 28 supplies a selected reference voltage through switch $S_5$, shown as being of positive polarity, which is added to the voltage on capacitor 104 and applied to the inverting input of amplifier 100. This input signal is integrated up in capacitor 102 until reoccurrence of clock phase $\phi_1$. At the same time, the previous (i.e., phase $\phi_1$) output voltage of amplifier 100, stored in capacitor 114, plus the reference voltage from switch $S_5$ which is now stored on capacitor 103, are supplied to the inverting input of amplifier 110, and the previous (i.e., phase $\phi_1$) output voltage of amplifier 110, stored on capacitor 124, is supplied to the inverting input of amplifier 120. Each of amplifiers 100, 110 and 120 thus performs an integration of the input voltage supplied to its respective inverting input terminal until phase $\phi_1$ again occurs.

If the signal at the input to the comparator 116 is positive, the switch $S_5$ is connected to the positive reference $+V_{ref}$, while if the signal is negative, switch $S_5$ is connected to the negative reference $-V_{ref}$. The signal at the comparator input is determined by an integration of a difference between the voltage developed on capacitors 103 and 114. The voltage on the output of integrator 22 is an integration of the difference between the input signal and either the positive or negative references depending on the position of switch $S_5$. The output signal of integrator 22 can also be viewed as the integrated difference between the analog input signal and the digital representation of the analog input signal.

Integrator 22 acts as a noninverting integrator for the analog input signal, and as an inverting integrator for one-bit D/A converter 28 controlled by comparator 116. The output signal of integrator 22 changes every phase $\phi_2$ by an amount $(V_{in}-V_{D/A1})k_{1a}$, where $V_{D/A1}$ is the output voltage of D/A converter 28 while, during phase $\phi_1$, the output signal of integrator 22 remains held at the value established on the previous phase $\phi_2$. Integrator 36 operates in a similar manner, except that its input signal is the output signal of integrator 24 less the output signal of D/A converter 40; that is, the integrator 36 output signal changes every phase $\phi_2$ by an amount $(V_2-V_{D/A2})k_2$, where $V_2$ is the output voltage of integrator 36 and is held on phase $\phi_1$, and $V_{D/A2}$ is the output voltage of D/A converter 40.

The configuration of integrator 24 is slightly different from that of integrators 22 and 36 in that it uses separate capacitors 114 and 103 for its two input signals. This is necessary since different capacitor ratios are required for the two input signals to integrator 24. Specifically, the output signal of integrator 22 should be integrated with ratio $k_{1b}$ while the output signal of D/A converter 28 needs to be integrated with ratio $-2k_{1a}k_{1b}$, and therefore a combination of a noninverting and inverting switched capacitor integrator is employed as integrator 24. Through use of superposition, multiple input signals are accommodated by common connection at switch $S_4$ adjacent to the summing junction of op amp 110. Since each separate input capacitor 114 and 103 switches between ground and the op amp 110 negative input, switch $S_4$ can be shared, though individual switches $S_3$ and $S_9$ are needed for connection to the two input signals. The output signal of integrator 24 changes every phase $\phi_2$ by an amount $k_{1b}V_2-2k_{1a}k_{1b}V_{D/A2}$ and is held during phase $\phi_1$. In the circumstance that $k_{1a}=\frac{1}{2}$, the two input capacitors 114 and 103 have the same value and a single capacitor may be used instead, as with integrators 22 and 36.

The circuit of FIG. 6 is quite tolerant of capacitor mismatch errors. Each of the two switched capacitor integrators 22 and 36, respectively, employs a single switched capacitor 104 and 124, respectively, to take the difference of its two input signals. Therefore, the subtraction operation is immune to error. The remaining switched capacitor integrator 24 uses separate switched capacitors 114 and 103 to take the difference of its two input signals; however, matching errors here are negligible when referred to the input. The other remaining summation or difference operations are implemented digitally and are also error free. The only component mismatch related error is the departure of the product $k_{1a}k_{1b}$ from equaling $1/j_1g_1$. This has the effect of leaking in the quantization noise from the first stage by the amount $$[1-j_1g_1/(k_{1a}k_{1b})](1-z^{-1})^2 E_1(z) \tag{4}$$

to make the overall output voltage $V_o(z)$ become $$V_o(z)=z^{-3}(V_iz)+g_1(1-z^{-1})^3 E_2(z)+[1-j_1g_1/(k_{1a}k_{1b})](1-z^{-1})^2 E_1(z) \tag{5}$$

where $E_1$ represents the quantization noise of the first stage. Since the degree of mismatch, namely $1-j_1g_1/(k_{1a}k_{1b})$ multiplies a term that already has second order noise shaping, i.e., $(1-z^{-1})^2 E_1(z)$, a relatively large error in $k_{1a}$ or $k_{1b}$ can be tolerated without undue degradation. For instance, it can be shown that a 5% error in the product $k_{1a}k_{1b}$ would raise the total quantization noise by less than 1 dB at an oversampling ratio of 64 to 1.

Figure 7:
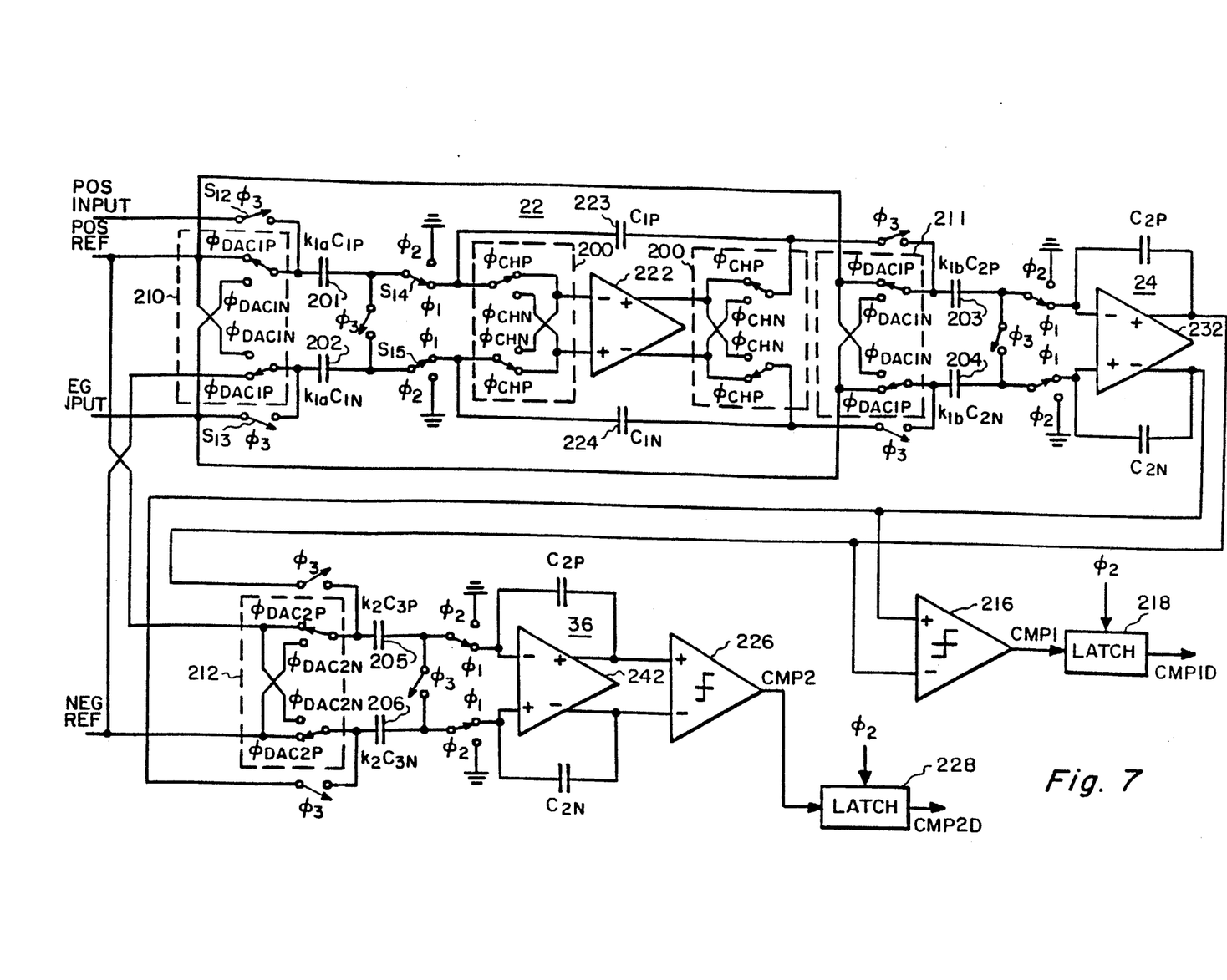
FIG. 7 is a circuit block diagram of a sampled data differential switched capacitor implementation of the third order sigma delta analog-to-digital converter network of FIG. 5.
Figure 8:
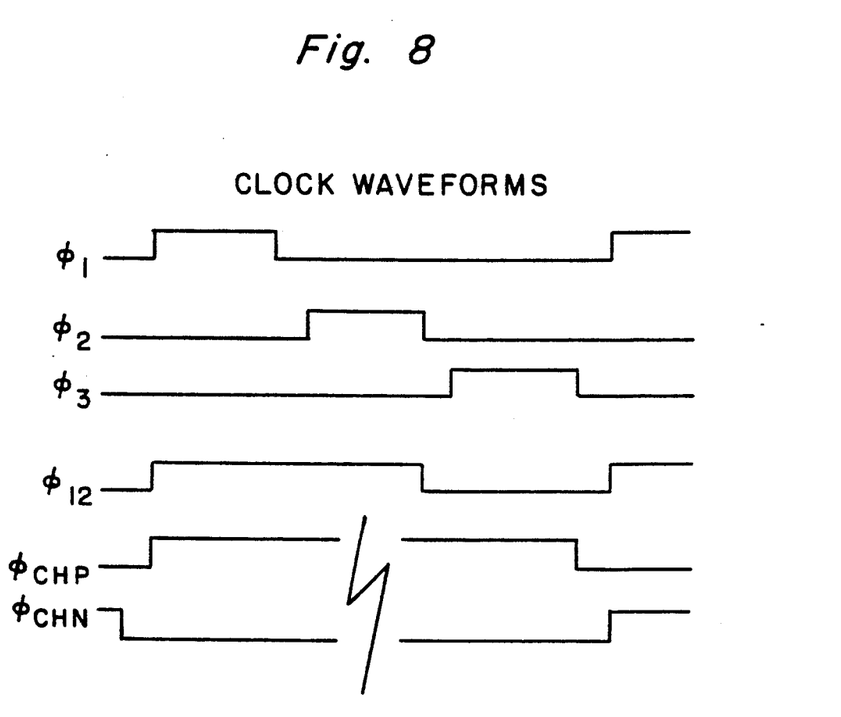
FIG. 8 illustrates waveforms of clock signals employed in the circuit of FIG. 7.
Figure 9:
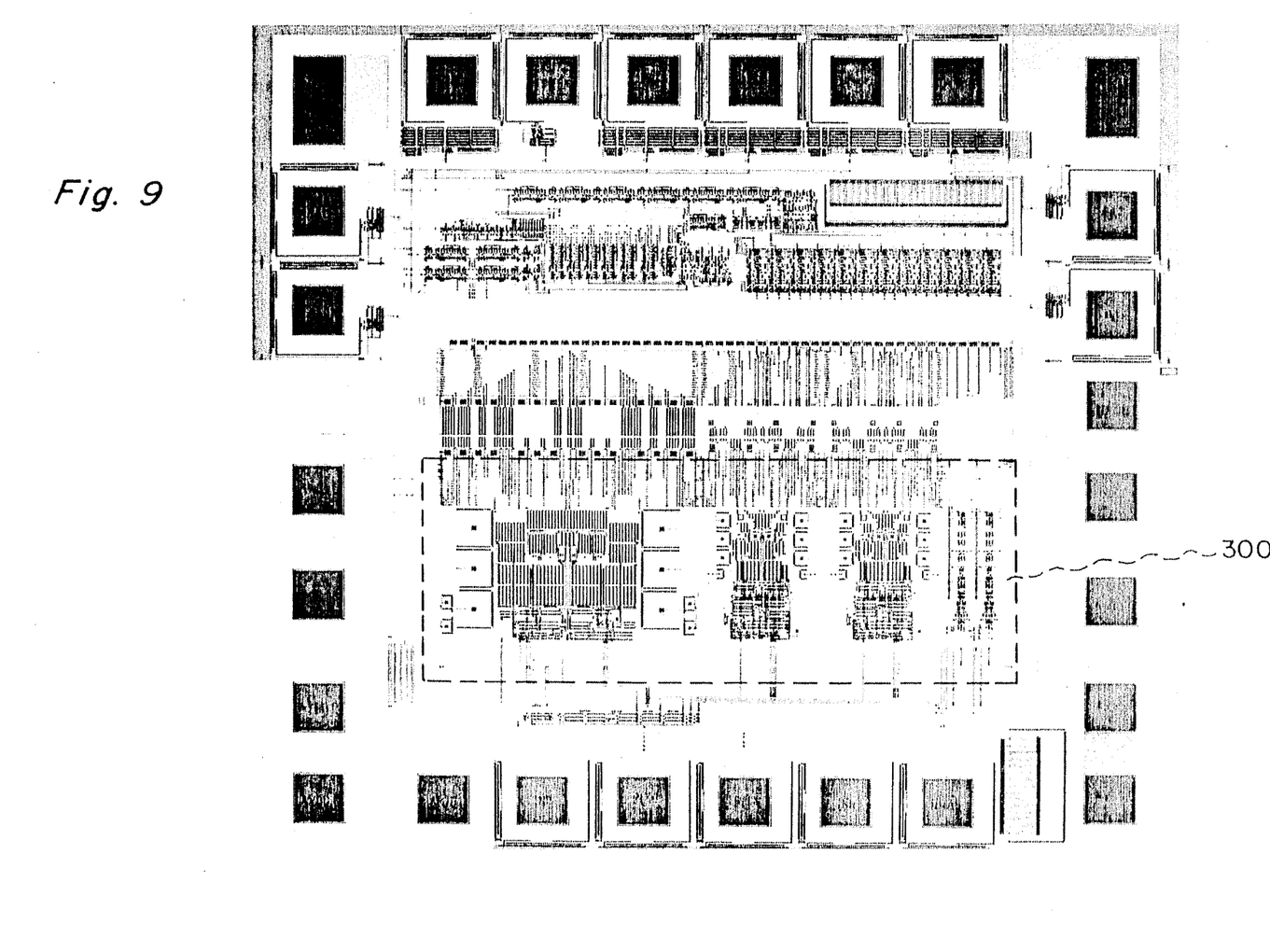
FIG. 9 is a plan view drawing of an integrated circuit chip on which the third order sigma delta analog-to-digital converter network of FIG. 7 is formed, illustrating the relative sizes of the integrator stages of the network.
Figure 10:
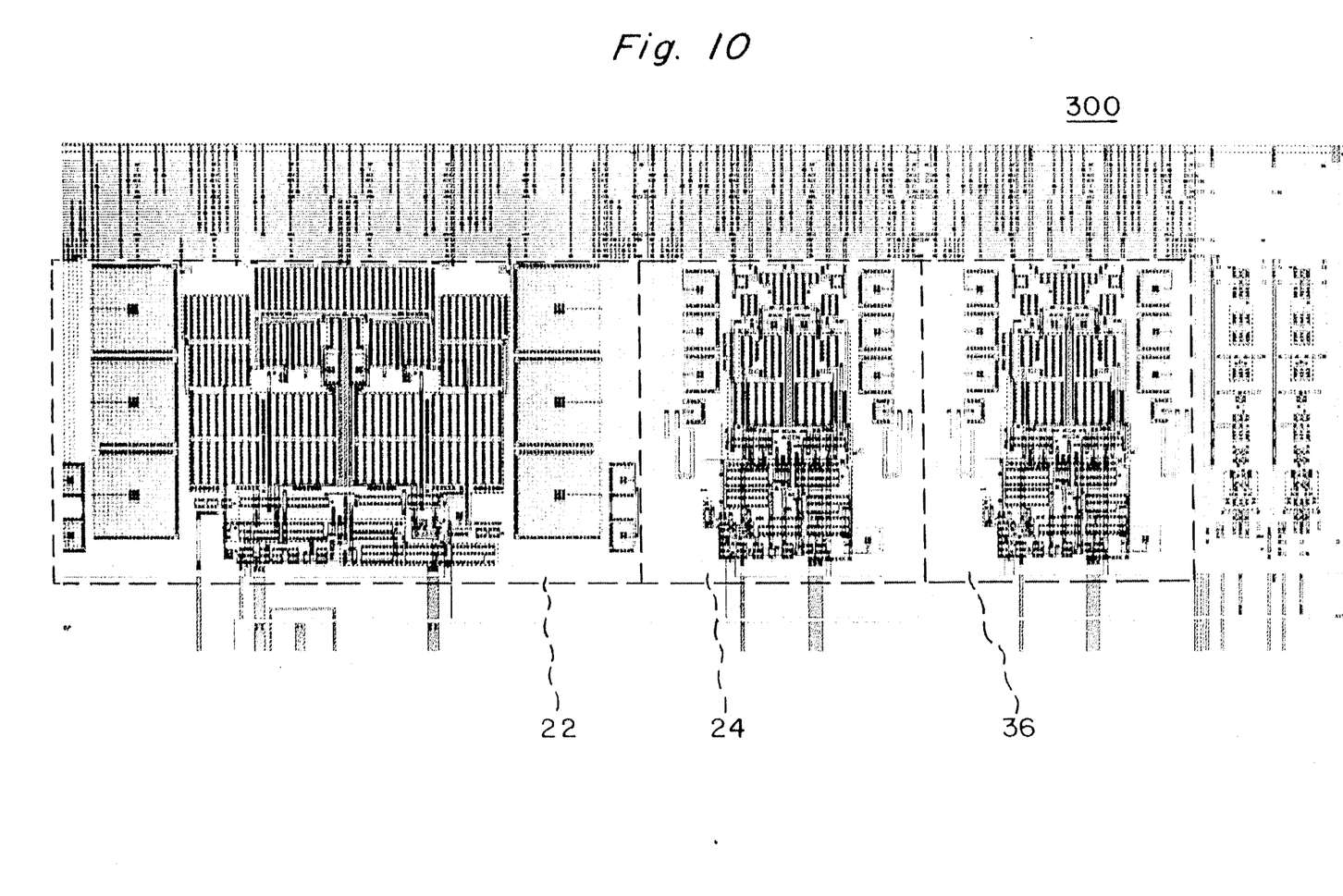
FIG. 10 is a plan view drawing of the modulator portion of the chip shown in FIG. 7, illustrative of the relative sizes of op amps and associated capacitors employed in the integrators of the analog-to-digital converter network of FIGS. 6 and 7.

The power and area reduction technique of this invention has been applied to a prototype third order oversampled modulator shown in FIGS. 7, 9 and 10. In the third order prototype of FIG. 7, the first integrator 22 employs a larger op amp 222, larger respective feedback capacitors 223 and 224, respectively, and input (sampling) capacitors 201 and 202, respectively, and larger metal-oxide-semiconductor (MOS) switches $S_{12}$, $S_{13}$, $S_{14}$ and $S_{15}$ than are used in the second and third integrators 24 and 36, respectively, in order to minimize kT/C noise in the first integrator. Op amp 222 of first integrator 22 is of larger power rating than op amps 232 and 242 of subsequent integrators 24 and 36, respectively, to more rapidly charge and discharge capacitors 223, 224, 201 and 202. Also, a chopper 200 can be used in first integrator 22, connected as shown in FIG. 7, to reduce noise in the first integrator. Since a chopper is not needed in the subsequent integrators, the chip areas utilized by these later integrators can be further reduced. Each of op amps 222, 232 and 242 employs balanced inputs and balanced outputs.

It was expected that the area occupied by differential amplifier (op amp) 222, capacitors 223, 224, 201 and 202, and switches $S_{12}$, $S_{13}$, $S_{14}$ and $S_{15}$ of first integrator 22 would be eight times larger than the area occupied by the corresponding op amps, capacitors and switches of integrators 24 and 36. Thus, in first integrator 22, the capacitance values of feedback capacitors 223 and 224 were 8pF and the capacitance values of input capacitors 201 and 202 were 4pF, while in the second and third integrators, the capacitance values of the feedback capacitors were 1pF and of the input capacitors were $\frac{1}{2}$pF. However, a strict power ratio of eight was not obtained due to the overhead of biasing and common mode feedback circuitry which was not scaled. The large op amp 222 dissipated 18.8 mW of power while the small op amps 232 and 242 each dissipated 4.8 mW of power. The area occupied by the large integrator 22 was 0.39 mm$^2$ and the areas occupied by the small integrators 24 and 36 were 0.18 mm$^2$ each. These areas also did not scale by a factor of eight due to the requirement for matching to the layout pitch of the larger integrator.

The relative sizes of integrators 22, 24 and 36 on the chip can be seen in the modulator portion 300 of the plot shown in FIG. 9 and shown in greater detail in FIG. 10. The following table provides a comparison of the reduced power/area version of the A/D converter network of the invention to a conventional version of the network in terms of power and area savings.

|  | Prior Approach | New Approach | % Reduction |
|---|---|---|---|
| Power Dissipation | 56 mW | 28 mW | 50% |
| Area | 1.2 mm$^2$ | 0.75 mm$^2$ | 37% |

This table indicates that significant improvement in both power dissipation and area is obtained in this particular implementation. It is contemplated that even greater benefit will result with use of higher order modulators.

Although the modulator components, i.e., the integrators, the analog-to-digital converters, and the digital-to-analog converters, are illustrated with single-ended outputs, the third order sigma delta analog-to-digital converter network of this invention can be implemented with a differential signal path using integrators with fully differential outputs for improved rejection of power supply noise. In addition, the invention is not limited to use of a digital decimation filter and any signal processing circuit capable of eliminating differential noise components can be employed.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

Having thus described our invention, what we claim as new and desire to secure by Letters Patent is as follows:

1. In a sigma delta analog-to-digital converter network formed on an integrated circuit chip, the improvement comprising:
   a first integrator comprising a differential amplifier, an associated input capacitor and an associated feedback capacitor; and
   one or more subsequent integrators each comprising a differential amplifier, an associated input capacitor and an associated feedback capacitor, said one or more subsequent integrators being responsive to output voltage from said first integrator;
   the differential amplifier of each of said subsequent integrators and the input and feedback capacitors associated therewith being smaller in area than said differential amplifier of said first integrator and the input and feedback capacitors associated therewith so as to minimize power dissipation in said subsequent integrators.

2. The analog-to-digital converter network improvement of claim 1, wherein:
   said capacitors associated with said first integrator are larger in capacitance than the corresponding capacitors of said subsequent integrators to minimize kT/C noise in said first integrator, where k is Boltzmann's constant, T is absolute temperature (°K.) of said first integrator and C is the capacitance of the input capacitor coupled to said first integrator (farads).

3. The analog-to-digital converter network improvement of claim 2, wherein:
   said differential amplifier of said first integrator is of larger power rating than the differential amplifiers of said subsequent integrators, so as to charge and discharge said larger capacitors associated with said first integrator as rapidly as the capacitors associated with said subsequent integrators.

4. A third order sigma delta analog-to-digital converter network formed on an integrated circuit chip, comprising:
   a second order modulator including first and second integrators coupled in cascade such that the output of said first integrator is coupled to the input of said second integrator;
   an analog-to-digital converter, the output of said second integrator being coupled to the input of said analog-to-digital converter for converting an analog input signal into a first digital output signal corresponding to the analog input signal plus a second order differential quantization noise component;
   means responsive to the output signal of said analog-to-digital converter for generating an analog output signal corresponding to said first digital output signal less any quantization noise of said second order modulator;
   a first order modulator comprising a third integrator coupled to the output of said second integrator and an analog-to-digital converter coupled to the output of said third integrator for converting the analog output signal of said second integrator into a second digital output signal corresponding to said analog output signal plus a first order differential quantization noise component; and
   means responsive to said first and second digital output signals of said second order and first order modulators, respectively, for eliminating the first and second order differential quantization noise components therefrom and generating a digital output signal corresponding to the analog input signal,
   each of said second and third integrators occupying less area of said chip than said first integrator.

5. The third order sigma delta analog-to-digital converter network of claim 4, wherein:
   each of said integrators comprises a differential amplifier, at least one input capacitor and at least one feedback capacitor,
   the differential amplifier of each of said second and third integrators, respectively, and said input capacitor and feedback capacitor coupled to each of said second and third integrators, respectively, occupying less area of said chip in comparison with said differential amplifier of said first integrator and said input and feedback capacitors coupled thereto, so as to maintain power dissipation in each of said second and third integrators at a lower level than power dissipation in said first integrator.

6. The third order sigma delta analog-to-digital converter network of claim 5, wherein:

said capacitors coupled to said first integrator are of larger capacitance than the corresponding capacitors coupled to said second and third integrators, so as to minimize kT/C noise in said first integrator, where k is Boltzmann's constant, T is absolute temperature (°K.) of said first integrator and C is the capacitance of the input capacitor coupled to said first integrator (farads).

7. The third order sigma delta analog-to-digital converter network of claim 6, wherein:

said differential amplifier of said first integrator is of larger power rating than the differential amplifiers of said subsequent integrators so as to charge and discharge said capacitors coupled to said first integrator as rapidly as the capacitors coupled to said second and third integrators.

8. On an integrated circuit chip, a third order sigma delta analog-to-digital converter network, comprising:

a second order modulator including first and second integrators coupled in cascade such that the output of said first integrator is coupled to the input of said second integrator, a first comparator coupled to the output of said second integrator for providing a first digital output signal, and a first switched reference voltage source responsive to said first comparator;

a first order modulator including a third integrator coupled to the output of said second integrator, a second comparator coupled to the output of said third integrator for providing a second digital output signal, and a second switched reference voltage source responsive to said second comparator;

said third integrator responding to the output signal of said second integrator and to said second switched reference voltage source to provide an analog output signal to said second comparator;

a digital multiplier for multiplying said second digital output signal from said first order modulator;

a digital subtractor for providing a digital difference signal between the digital output signal of said second order modulator and the multiplied digital output signal of said first order modulator;

a digital double differentiator coupled to the output of said digital subtractor for twice differentiating said digital difference signal to produce a resultant digital signal including a second order differential noise component from said second order modulator and a third order differential noise component from said first order modulator;

a digital adder for adding said first digital output signal and said resultant digital signal to produce a third digital output signal; and a digital decimation filter responding to said third digital output signal, each of said integrators comprising a differential amplifier, at least one input capacitor and at least one feedback capacitor, each differential amplifier of said second and third integrators and the capacitors respectively coupled thereto occupying less area of said chip than the differential amplifier of said first integrator and the capacitors respectively coupled thereto so as to maintain power dissipation in said second and third integrators below power dissipation in said first integrator.

9. The analog-to-digital converter network of claim 8, wherein:

said capacitors coupled to said first integrator are of larger capacitance than the corresponding capacitors coupled to said second and third integrators, so as to minimize kT/C noise in said first integrator, where k is Boltzmann's constant, T is absolute temperature (°K.) of said first integrator and C is the capacitance of the input capacitor coupled to said first integrator (farads).

10. The analog-to-digital converter network of claim 9, wherein:

said differential amplifier of said first integrator is of larger power rating than the differential amplifiers of said second and third integrators so as to charge and discharge said capacitors coupled to said first integrator as rapidly as the capacitors coupled to said second and third integrators.

11. The analog-to-digital converter of claim 8 including a first latch coupled to the output of said first comparator, the output of said first latch being coupled to said first switched reference voltage source, and a second latch coupled to the output of said second comparator, the output of said second latch being coupled to said second switched reference voltage source.

12. The analog-to-digital converter of claim 8 wherein each said differential amplifier includes balanced inputs and balanced outputs.

* * * * *